US005773314A

United States Patent [19]

Jiang et al.

[11] Patent Number: 5,773,314
[45] Date of Patent: Jun. 30, 1998

[54] PLUG PROTECTION PROCESS FOR USE IN THE MANUFACTURE OF EMBEDDED DYNAMIC RANDOM ACCESS MEMORY (DRAM) CELLS

[75] Inventors: Bo Jiang, Austin; Peter Zurcher, Dripping Springs; Robert E. Jones, Austin; Bruce E. White, Round Rock, all of Tex.

[73] Assignee: Motorola, Inc., Schaumburg, Ill.

[21] Appl. No.: 845,457

[22] Filed: Apr. 25, 1997

[51] Int. Cl.[6] .................................................. H01G 7/06
[52] U.S. Cl. .............................................. 438/3; 438/240
[58] Field of Search ........................................ 438/3, 240

[56] References Cited

U.S. PATENT DOCUMENTS

| | | | |
|---|---|---|---|
| 4,982,309 | 1/1991 | Shepherd | 361/321 |
| 5,189,594 | 2/1993 | Hoshiba | 257/295 |
| 5,466,629 | 11/1995 | Mihara et al. | 438/3 |
| 5,471,364 | 11/1995 | Summerfelt et al. | 361/321.4 |
| 5,478,722 | 12/1995 | Fazan | 438/253 |
| 5,510,651 | 4/1996 | Maniar et al. | 257/751 |
| 5,536,672 | 7/1996 | Miller et al. | 438/3 |
| 5,567,636 | 10/1996 | Jones, Jr. | 438/3 |
| 5,573,979 | 11/1996 | Tsu et al. | 438/3 |
| 5,585,300 | 12/1996 | Summerfelt | 438/3 |

*Primary Examiner*—Jey Tsai
*Attorney, Agent, or Firm*—Keith E. Witek

[57] ABSTRACT

A method for forming an embedded DRAM structure along with tungsten plugged MOS transistor devices begins by forming capacitor tungsten plugs (46) and bit-line tungsten plugs (44). A bottom capacitor electrode (48b) is formed to protect the tungsten plug (46). Simultaneously, an optionally-removable barrier region (48a) is formed to protect the plug (44). A capacitor dielectric (52) is deposited and oxygen annealed to form a ferroelectric capacitor material. The barrier (48a) and the lower electrode (48b) protect all of the tungsten plugs (46 and 44) from being adversely oxidized by the oxygen anneal. A top electrode (54 and 56) of the ferroelectric capacitor is then deposited, lithographically patterned, and etched. The lithographic patterning and etching of the top electrode may also be further utilized to remove the barrier region (48a).

39 Claims, 4 Drawing Sheets

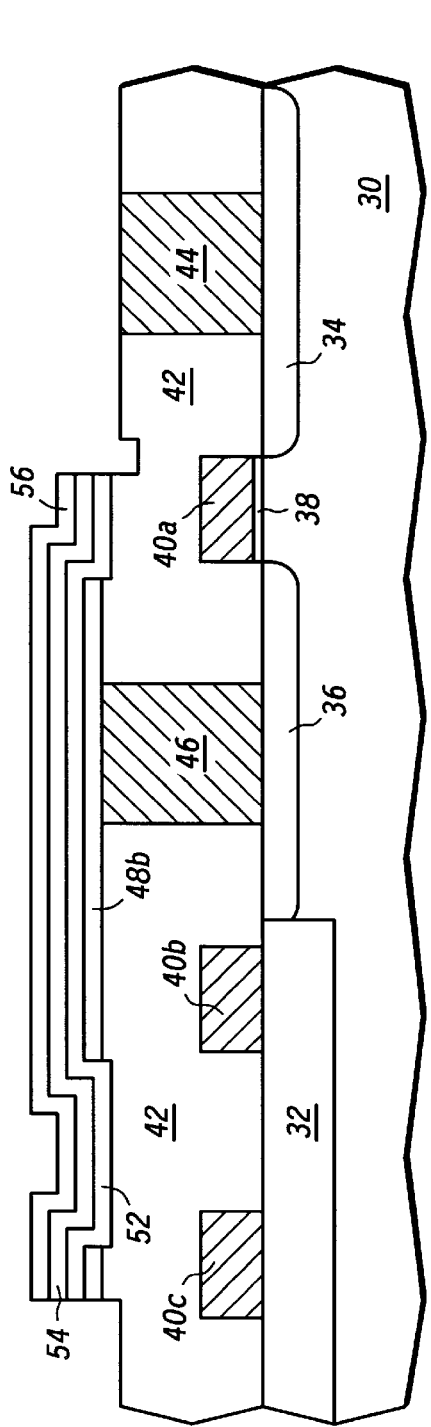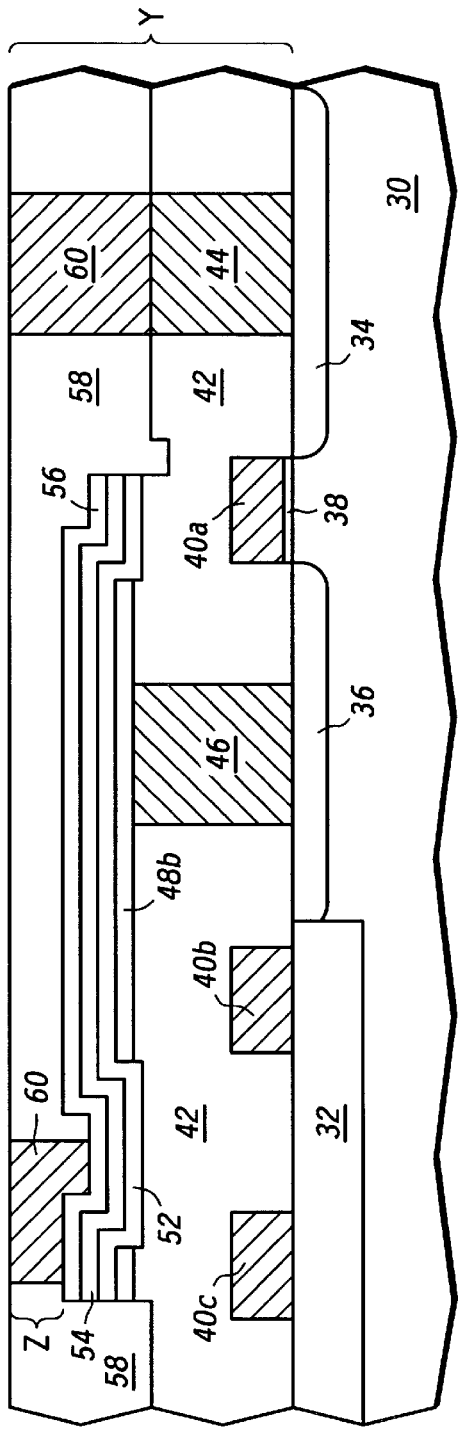

PLUG PROTECTION PROCESS FOR USE IN THE MANUFACTURE OF EMBEDDED DYNAMIC RANDOM ACCESS MEMORY (DRAM) CELLS

FIELD OF THE INVENTION

The present invention relates generally to memory integrated circuit manufacturing, and more particularly to, the protection of metallic transistor-contacting plugs from the oxygen annealing of high-K dielectric DRAM capacitors.

BACKGROUND OF THE INVENTION

The semiconductor industry is currently developing semiconductor products which contain embedded ferroelectric DRAM. In other words, conventional MOS transistor logic is now being considered for integration on-chip along with ferroelectric DRAM memory arrays in order to provide embedded ferroelectric DRAM. However, the combination of conventional MOS transistor technology and the exotic materials, exotic anneals, and new etch chemistries of ferroelectric processing causes considerable process compatibility concerns when integrating ferroelectric devices with conventional MOS devices. One of these concerns is illustrated in prior art FIG. 1.

FIG. 1. illustrates a substrate 10. Current electrodes 12 and 14 are formed within the substrate 10 to form source and drain electrodes of a transistor. A gate electrode 16 of the transistor is formed as illustrated in FIG. 1. A dielectric layer 22 is deposited and is patterned to form contact openings 18 and 20. In a first embodiment, the contact openings 18 and 20 are plugged (or filled) with polysilicon material. The polysilicon plug 18 is used to contact the electrode 14 to an overlying DRAM ferroelectric capacitor 24. In the example shown in FIG. 1, a bottom capacitor electrode 23 of the ferroelectric capacitor 24 is deposited and patterned prior to the deposition of the other capacitor layers. The deposition of layers of the DRAM capacitor 24 protect the plug 18 from adverse exposure to ferroelectric exotic anneals and materials. However, the polysilicon plug 20 is left exposed to the exotic ferroelectric processing in order to contact the polysilicon plug 20 to overlying metal layers. The exposure of this plug 20 during formation of the capacitor 24 creates unwanted yield reduction and integration problems in embedded DRAM structures products.

First, many ferroelectric materials used to form the capacitor 24 require oxygen anneals in order to render the capacitor dielectric functional. The polysilicon plug 20 will be exposed to this oxygen anneal since current conventional processing is not capable of protecting this plug 20. Since the plug 20 is conventionally polysilicon, the polysilicon conductive plug 20 will begin to oxidize due to the oxygen anneal process used to form the capacitor 24. This oxidation of a top portion of the plug 20 creates some integration problems. First, electrical contact to the plug 20 is made more difficult by the top oxide layer on plug 20. In addition, the coefficient of expansion for polysilicon when polysilicon is converted to silicon dioxide ($SiO_2$) is roughly 2.2 and results in some unnecessary mechanical stress within the plug 20, the substrate, and overlying conductive layers. However, polysilicon generally forms a passivation layer which renders oxidation progressively more difficult as the oxide layer on the plug 20 begins to form. In addition, conventional etch processes exist which enable one to remove this unwanted oxidized layer over the plug 20 to render contact at least possible. For these reasons, the oxidation of the polysilicon region 20 and yield reduction therefrom would typically be tolerated in an IC fabrication facility which uses polysilicon plug processing in order to achieve integration.

In an alternate embodiment, if the oxidation of polysilicon plug could not be tolerated in the IC fabrication facility, then the process could be altered. In this altered process, the polysilicon plug 20 would not be formed until after the capacitor 24 of FIG. 1 has been formed. In this alternate embodiment, the contact 18 would be formed in FIG. 1 with the first set of lithographic masks. The capacitor 24 would then be formed using a second set of lithographic masks. Finally, the contact 20 would be formed subsequent to the capacitor 24 and the plug 18 using a third set of lithographic masks. The theory here is that, if the plug 20 is not formed before the capacitor 24, then the exotic processing of the capacitor cannot harm the plug 20. However, this process of forming the contacts 18 and 20 at different times in the process results in additional processing steps, additional masks, increased cost, reduced throughput, and a more difficult etch process to form the plug 20. Therefore, while this process has advantages in that the polysilicon oxidation of the plug 20 which was discussed above is avoided, significant other problems result in this alternate integration process.

To add more complexity to the problem, current conventional MOS logic devices are utilizing tungsten (W) plug technology. The use of tungsten plugs instead of polysilicon plugs poses significant barriers to embedded DRAM since the use of tungsten (W) greatly exacerbates the oxidation process discussed and illustrated in FIG. 1. If tungsten is used as a plug 20, tungsten oxidizes much faster and at much lower temperatures than polysilicon. For this reason, oxygen annealing of embedded ferroelectric capacitors 24 causes significantly more damage and more oxidation of an unprotected tungsten plug. Unlike polysilicon which expands by a factor of 2.2, tungsten will expand at approximately a factor of 3.0 creating significantly more mechanical stress within a semiconductor device. Unlike polysilicon, tungsten (W) oxidizes at a relatively fast rate since the layer of tungsten oxide formed at the surface has a limited ability to protect against subsequent oxidation. In other words, the tungsten will continue to oxidize until the tungsten is entirely consumed if the length of oxygen exposure is long. The volume expansion of the tungsten upon oxidation results in extrusion of the plug material from the contact opening making subsequent integration impractical. Furthermore, even if only a limited amount of W is oxidized, there is no conventional etch chemistry which can remove tungsten oxide from the top of the plug 20 whereby effective electrical top-contact to plug 20 is totally lost once oxidation occurs during ferroelectric capacitor processing.

Therefore, a process which allows for the formation of ferroelectric capacitors embedded with MOS tungsten plug technology is needed since current technology will result in tungsten plug oxidation and a non-functional device. In other words, the integration of ferroelectric devices on-chip with MOS logic containing tungsten plugs creates new problems in integration not before seen in the art.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which:

FIGS. 6–8 illustrate, in cross-sectional diagrams, the final steps for forming an embedded ferroelectric DRAM on-chip with MOS tungsten-plugged transistors in accordance with the present invention.

DETAILED DESCRIPTION OF THE DRAWINGS

Figure 1:
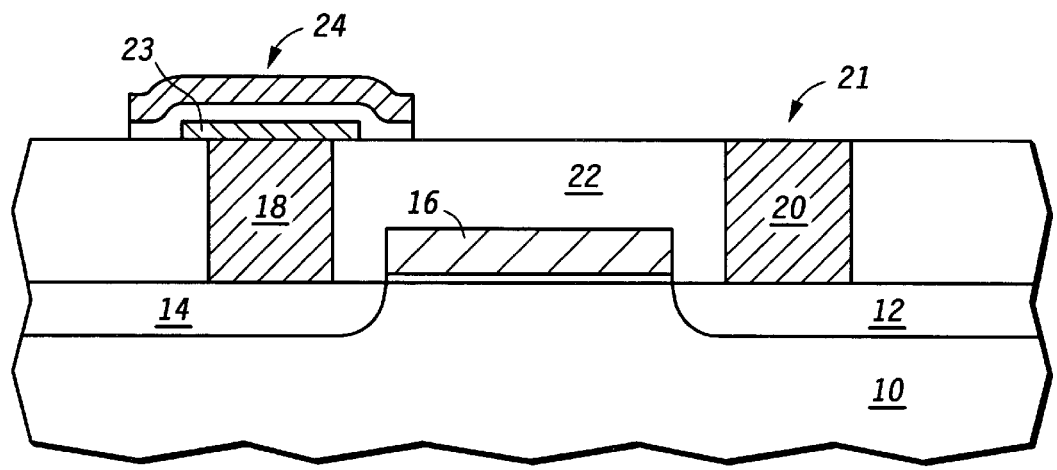
FIG. 1 illustrates, in a cross-sectional diagram, a prior art problem of exposed plugs which oxidize to reduce yield or render devices non-functional.

Generally, the present invention is a method for forming ferroelectric DRAM memory arrays embedded on-chip with MOS transistor technology which utilizes tungsten (W) plugs. Ferroelectric DRAM capacitors contain dielectric materials which require oxygen anneals to activate the dielectric and render the dielectric functional. Unfortunately, this oxygen anneal is performed after a point in time where tungsten plugs are preferably formed for the MOS transistors. Therefore, any tungsten plugs which are not contacted to a capacitor layer are exposed to the ambient and directly affected by the oxygen ferroelectric anneal whereby the tungsten will readily begin to oxidize. Tungsten, unlike other materials used for conductive plugs, oxidizes at a very fast rate and at low temperatures. Tungsten, unlike other conductors, has a large coefficient of expansion (3.0) when converting from tungsten to tungsten oxide and causes significant stress and yield reduction within integrated circuits (ICs). Tungsten, unlike polysilicon, oxidizes at a relatively fast rate since the layer of tungsten oxide formed at the surface has a limited ability to protect against subsequent oxidation, and tungsten (W) will continue to oxidize until all tungsten within the plug is entirely consumed. In addition, there is no known etch chemistry which is readily integrable with MOS processing which can be utilized to remove tungsten oxide on top of an oxidized tungsten plug. Therefore, a need exists for a process which allows for ferroelectric DRAM technology to be integrated with tungsten plug MOS technology on the same chip without this tungsten oxidation problem and without adversely affecting throughput, costs, and IC yield.

The solution to the tungsten oxidation problem that occurs when ferroelectric DRAM cells are mixed with tungsten plug MOS technology integration involves the use of an optionally sacrificial barrier region. In essence, the same material which is used to form a bottom electrode of the ferroelectric capacitor is also patterned and used to form the oxygen barrier regions over tungsten plugs which are not to be contacted to ferroelectric capacitors. Typically, this barrier region is made of some iridium layer, since iridium is a good conductive layer for ferroelectric capacitor electrodes and is simultaneously a good oxygen barrier which readily prevents oxidation of underlying tungsten regions. Therefore, the process taught herein of utilizing an iridium or like barrier layer is an improvement over the prior art since tungsten oxidation is either completely or substantially avoided. Furthermore, the process taught herein will incorporate tungsten plug protection without decreasing throughput, without substantially increasing product costs, without adding additional mask or etch steps, or without complicating MOS etch processes as is the case with respect to the prior art solutions discussed herein.

The invention can be further understood with reference to FIGS. 2–8.

Figure 2:
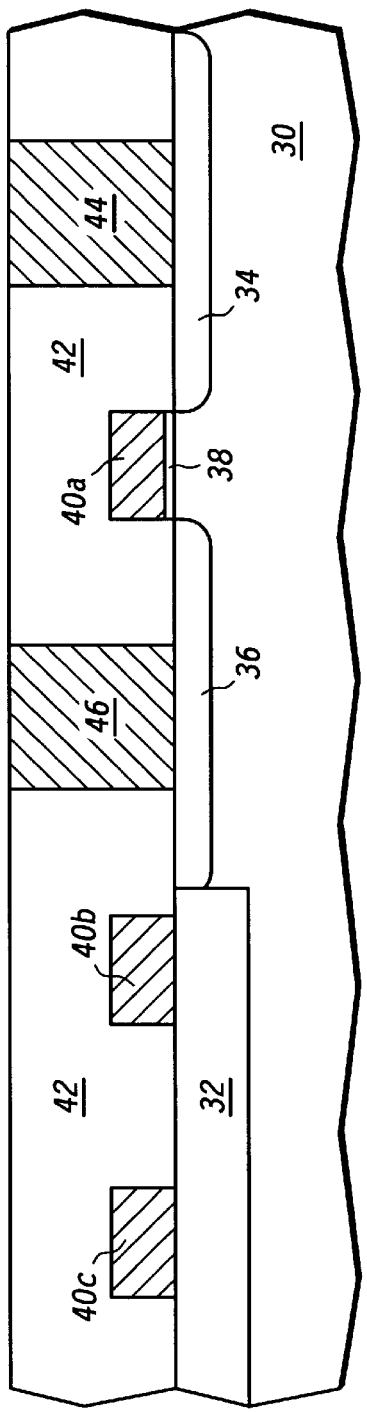
FIGS. 2–3 illustrate, in cross-sectional diagrams, the beginning steps for forming a ferroelectric embedded DRAM on-chip with MOS transistor technology formed with tungsten plugs in accordance with the present invention.

FIG. 2 illustrates the beginning steps which are used to form a transistor and at least two tungsten (W) plugs. FIG. 2 illustrates a substrate 30. Substrate 30 is typically a silicon substrate, but can be any semiconductor substrate containing germanium, gallium arsenide, or the like, and may also be silicon-on-insulator (SOI) substrate. Isolation regions 32 are formed within the substrate 30. In FIG. 2, the isolation regions 32 are illustrated as trench isolation regions. It should be noted that any other isolation scheme such as field oxide LOCOS or the like can be used for field isolation herein.

FIG. 2 illustrates the formation of a transistor having a first current electrode 34, a second current electrode 36, a gate dielectric 38, and a polysilicon gate electrode 40a. The source and drain electrodes 34 and 36 are formed via self-aligned ion implantation steps which are known in the art. In another form, not illustrated in FIG. 2, lightly doped drain (LDD) regions can be formed as the electrodes 34 and 36 within the substrate 30. Gate dielectric layer 38 is typically formed by thermal oxidation and is typically between 40 angstroms and 100 angstroms in thickness. In other forms, the gate dielectric 38 may be a composite gate dielectric comprising deposited dielectrics and/or thermally grown dielectrics. The polysilicon gate electrode 40a is formed by depositing a first layer of polysilicon. Lithographic processing and etch processing is used to segment the first layer of polysilicon into gate electrodes 40a and conductive memory array interconnects 40b and 40c for the memory array as illustrated in FIG. 2. Note that the source and drain electrodes herein and/or the gate electrodes taught herein are optionally salicided or silicided to contain refractory metal content.

After formation of the polysilicon gate electrodes 40a, an inter-level dielectric 42 is deposited. In a preferred form, the inter-level dielectric is a tetraethylorthosilicate (TEOS) layer or a combination of TEOS and ozone TEOS to provide improved void-filling capacity. In other forms, the layer 42 may contain borophosphosilicate glass (BPSG), silicon nitride, etch stop layers, polish stop layers, or like dielectric material. When the inter-level dielectric 42 is first deposited, the inter-level dielectric 42 is usually conformal and has a topography which is non-planar due to non-planar underlying features such as the regions 40a, 40b, and 40c. In order to planarize a top surface of the layer 42, a chemical mechanical polishing (CMP) step is preferably utilized. In an alternative, chemical mechanical polishing (CMP) can be replaced with a resist etch back (REB) process or blanket etch back process which instead of being primarily mechanically abrasive in nature is a process which removes and planarizes dielectric layers through primarily chemical interaction. The result from the CMP or resist etch back process is illustrated as a planar layer 42 in FIG. 2.

After layer 42 is planarized by CMP or REB, contact openings are formed as illustrated in FIG. 2. A first contact opening is formed to expose the first current electrode 36 and a second contact opening is formed to expose a second electrode 34. A layer of tungsten (W) is then deposited via a chemical vapor deposition (CVD) process. This initial deposition of tungsten not only fills the contact openings of FIG. 2, but will also cover top planar surfaces of the inter-level dielectric (ILD) 42. Therefore, a CMP or resist etch back process is needed in order to reduce the tungsten layer to tungsten plugs 44 and 46 as illustrated in FIG. 2. It is important to note that the tungsten plugs 44 and 46 of FIG. 2 may be formed by tungsten, tungsten silicide, or like tungsten containing materials. In addition, the tungsten plugs 44 and 46 can be lined with one or more of titanium nitride (TiN), titanium tungsten (Ti/W), or like liners or composites of liner layers before CVD deposition of the bulk of tungsten (W) occurs.

Figure 3:
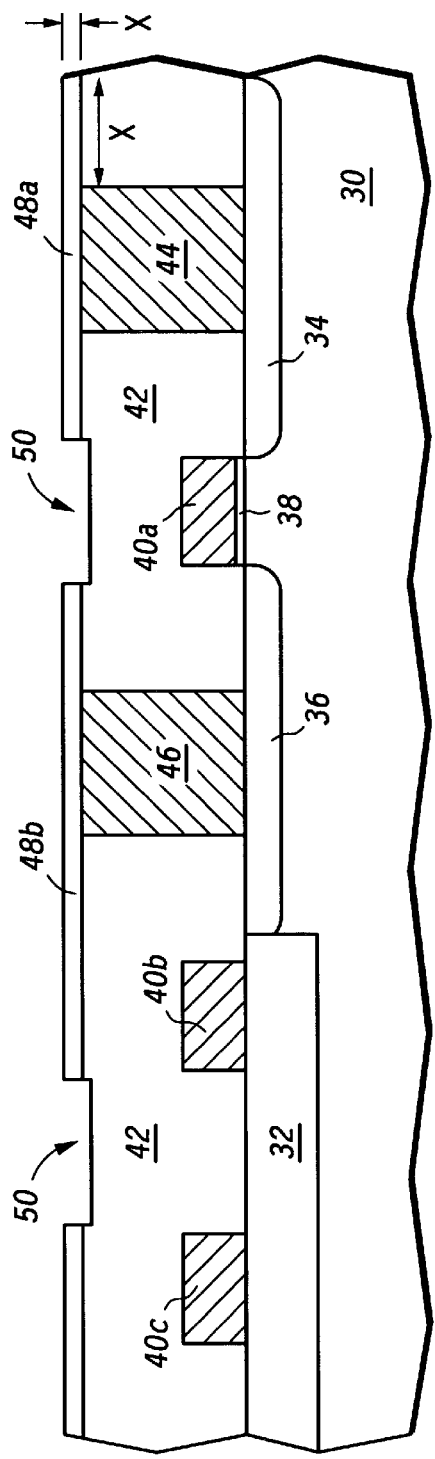

FIG. 3 illustrates that a bottom electrode and barrier material region is blanketly deposited over the tungsten plugs 44 and 46. In a preferred form, the bottom electrode and barrier layer will contain at least an iridium layer. In another form, the bottom electrode and barrier layer will contain a first layer of iridium and a second layer of platinum. In yet other forms, iridium may be replaced with palladium. In yet another form, the bottom electrode and barrier layer may contain iridium and iridium oxide as a composite layer. Additionally, both the bottom electrode and barrier layer can be formed by the deposition of a single layer of iridium or conductor comprised of iridium. Once this blanket bottom electrode layer and barrier layer is deposited, photoresist lithographic processing and etch technology is used to segment this bottom electrode and barrier layer into a bottom capacitor electrode 48b and a barrier region 48a. Removal of the iridium or the iridium platinum composite is performed by using either argon ion milling (or a like ion milling process) and/or plasma etch process using a chlorine etch chemistry. In addition, the iridium is typically formed by sputter deposition and the optional platinum is also deposited via a sputtering process.

FIG. 3 illustrates that the thickness of the region 48a is labeled as X. This dimension X indicates that, for most processes, the barrier layer is required to be equal to or thicker than a minimum thickness X in order to fully protect the underlying tungsten plugs 44 and 46. If the thickness of layer 48 is the thickness X or greater, the tungsten plugs 44 and 46 will be fully protected from any adverse consequences of the subsequent ferroelectric DRAM capacitor dielectric oxygen ($O_2$) annealing. Typically, the thickness X will range anywhere from a few hundred angstroms to 2,500 angstroms depending upon the type of composite layer used to form layers 48a and 48b and depending upon the type of oxygen annealing process subsequently utilized in FIG. 6. FIG. 3 also illustrates that the lithographic patterning of region 48a must be such that the lithographic dimension/width of region 48a is separated from an edge/sidewall of the tungsten plug 44 by a dimension greater than or equal to X as illustrated in FIG. 3. If the region 48a is lithographically patterned too close to the sidewall of the tungsten plug 44, then oxygen will be able to seep through the barrier 48a and begin oxidizing a corner portion of the tungsten plug 44 which will create undue stress and increased tungsten oxidation resulting in reduced yield. Therefore, both proper thickness and proper lithographic spacing of the region 48a is needed to ensure full protection of the contact plug 44 from the oxide annealing process taught via FIG. 6.

Figure 4:
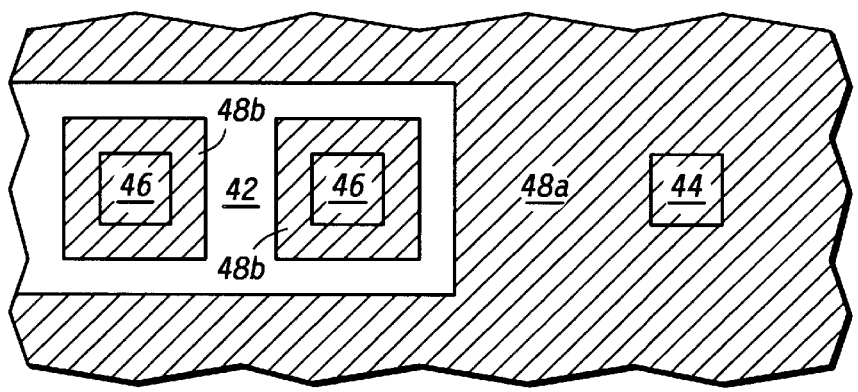
FIGS. 4–5 illustrate, in top perspective view, two different configurations for tungsten plug protective layers illustrated in FIG. 3 in accordance with the present invention.
Figure 5:
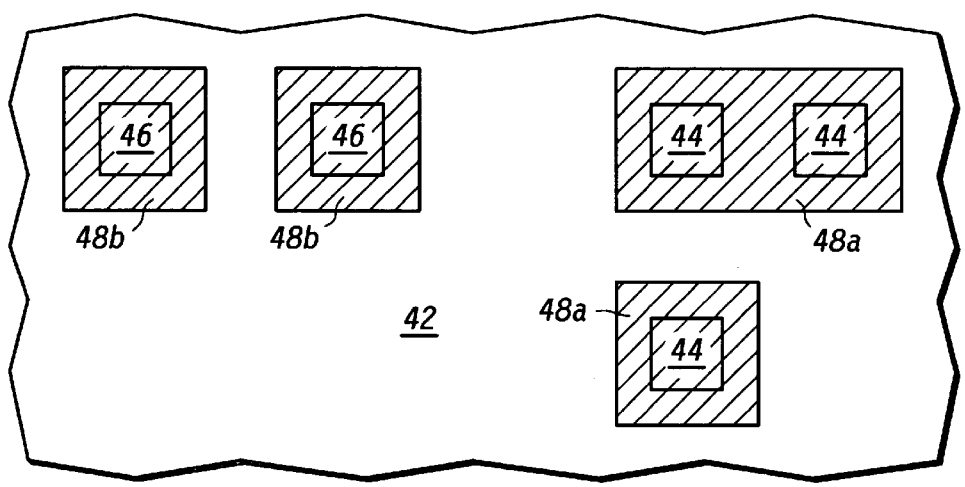

FIGS. 4–5 illustrate two different top perspective views of two different geometric layout embodiments which can be utilized for the regions 48a and 48b of FIG. 3. FIG. 4 illustrates two tungsten-plugged capacitor contact holes 46. Each tungsten-plugged capacitor contact 46 underlies a lithographically patterned and etched bottom capacitor electrode 48b which contains iridium or palladium and optionally contains one or more of a platinum, iridium oxide or TiN. Areas around the bottom electrodes 48b are removed via photoresist masking and ion milling and/or chlorine etch processing in order to expose the underlying ILD 42 as illustrated in FIG. 4. In FIG. 4, all other regions of the integrated circuit (IC) are encapsulated and blanket protected by the barrier layer 48a without regard to lithographic dimensions of individual contacts 44. The use of this process to pattern region 48a ensures that the thicknesses X and lithographic distances X discussed via FIG. 3 are always adequate. However, the lack of exposed oxide 42 may result in subsequent etch processing endpointing being more difficult than otherwise possible.

FIG. 5 illustrates a top perspective view of an alternative configuration of regions 48a and 48b of FIG. 3 that result in improved endpoint detection capability. In FIG. 5, DRAM tungsten plug connections 46 underlie lithographically patterned and etched bottom capacitor electrodes 48b so that the electrodes 48b provide adequate oxygen barrier protection. In addition, regions 48a, which surround and protect the tungsten plugs 44 from the ferroelectric DRAM oxidation anneal processing, are reduced in overall surface area to expose more of the underlying oxide 42 for endpoint purposes. It is important to note that non-DRAM-coupled contacts 44 which are placed within close design rule constraints may need to be group into a single barrier region 48a as illustrated in a top portion of FIG. 5. If this were not the case and each closely-separated contact 44 required lithographically-separated barrier regions 48a, then MOS logic surface area would be adversely affected in some or all devices (i.e., design rule dimensions may need to be enlarged). Isolated contacts 44 which are physically separated by larger distances from other contacts 44 may be encapsulated and barrier protected by their own exclusive region 48a without adversely affecting surface area or minimum design rule constraints.

FIG. 6 illustrates that a capacitor dielectric layer 52 is deposited overlying the bottom electrode 48b. In general, dielectric 52 can be any ferroelectric material or high dielectric constant (high-K) material. In a preferred form, layer 52 is formed as a layer of BST ($Ba_xSr_{1-x}TiO_3$). In other embodiments layer 52 is formed as a layer of PZT ($PbZr_xTi_{1-x}O_3$), PLZT (La doped PZT), or other lead (Pb) based ferroelectric or high dielectric constant dielectric. In yet other embodiments layer 52 can be comprised of a bismuth (Bi) layered perovskite such as SBT ($SrBi_2Ta_2O_9$), SBN ($SrBi_2Nb_2O_9$), or SBNT ($SrBi_2Nb_xTa_{1-x}O_9$). As discussed above, the memory circuit can be a DRAM and the dielectric layer 52 will preferable be a high dielectric constant or paraelectric material. Alternatively, the memory circuit can be a ferroelectric nonvolatile memory and the dielectric layer 52 will be a material in the ferroelectric phase.

In one form, the dielectric 52 can be in-situ exposed to an oxygen ($O_2$) environment during deposition by placing oxygen in the deposition environment. In yet another form, the layer 52 can be sputtered from an oxidized ferroelectric target where the oxide in the target provides some oxygen to the ambient. In yet another form, the layer 52 may be first sputtered or deposited, and then exposed to an oxygen anneal environment after deposition in an ex-situ manner. In this case, oxygen annealing will typically occur at a temperature between 500° C. and 650° C. Note that the oxygen annealing ambient need not be entirely oxygen but may include other gases, such as inert carriers. In yet another form, the layer 52 may be exposed to oxygen by some combination of an oxidized sputter target, in-situ oxygen exposure, and/or post-deposition ex-situ oxygen annealing. In any event, the layer 52 is exposed to the oxygen annealing process while the region 48a of FIGS. 3–5 is still present on the semiconductor device to protect the plug 44 from the oxygen atoms in the ambient.

After formation of the capacitor dielectric 52, a conductive top electrode of the capacitor is formed. A first portion of this electrode is illustrated as layer 54 in FIG. 6. Layer 54 is very similar to the bottom electrode 48b of FIG. 3. In other words, the layer 54 will contain iridium or palladium and optionally contain one or more of platinum, other refractory metals, and/or iridium oxide. A titanium nitride (TiN) barrier layer 56 is formed overlying the layer 54. The layer 56 is utilized as an anti-reflective coating (ARC) and an etch stop layer for subsequent DRAM capacitor contacts (see FIG. 8).

In one form, the layer 52 can be annealed and etched independent of the layers 54 and 56. However, in a preferred form, layers 52, 54, and 56 are all lithographically patterned and etched in a single lithographic and etching step after performing oxygen annealing of layer 52 before layer 54 deposition. In one form, which is not illustrated in FIG. 6, this etch process which is used to define the upper electrode via the etching of layers 54 and 56 will not effect the barrier region 48a. In other words, the region 48a of FIG. 3 may be left behind on the final device, unlike that illustrated in FIG. 6. However, the leaving behind of the layer 48a has some unfortunate but potentially tolerable consequences. One main disadvantage is that the layer 48a is conductive and will result in the design rule spacings of the contacts 44 being significantly increased. Therefore, to avoid this increasing of design rules and to fully utilize all of the previously designed logic gates within the embedded device without the need for re-design, the etch process which is used to etch portions of the layers 52, 54, and 56 is also utilized to strip away the region 48a from the wafer surface.

The result, at the end of FIG. 6, is a complete integration of a ferroelectric oxygen-annealed embedded DRAM structure along with fully-functional non-oxidized tungsten plugs which are subsequently used for non-DRAM-electrode interconnection purposes (e.g., coupled to sense amplifiers, bit lines, MOS logic, etc.). It is important to note that all or most of the transistors in the MOS logic or CPU portion of the chip will have all nodes protected by the removable region 48a and no nodes covered by electrodes 48b since no DRAM capacitors are typically present in the MOS logic area. Therefore, the memory cell illustrated in FIG. 6 can easily be integrated in an embedded manner with microcontrollers, central processing units (CPU), any microprocessor or any other memory-containing device which comprises tungsten (W) plugs.

FIG. 7 illustrates processing which occurs after formation of the capacitor is complete. FIG. 7 illustrates that another inter-layer dielectric (ILD) 58 is deposited and chemically mechanically polished (CMP) or etched to form a planar layer. Openings are formed within the layer 58 to form conductive plugs 60.

An important processing advantage will now be illustrated with respect to FIG. 7. A right hand portion of FIG. 7 illustrates a depth Y or thickness Y. Depth or thickness Y is the thickness through which a contact must be formed in order to contact the source and drain region 34 to overlying metal layers. A left-hand portion of FIG. 7 illustrates a depth Z. Depth Z is the amount of oxide which must be removed in order to form a contact plug in contact with the top capacitor electrode 54 and 56. In the prior art as discussed herein, one way to avoid plug oxidation would be to form the entire plug 60 and 44 in FIG. 7 long after the ferroelectric capacitor has completed formation in FIG. 6. However, if this process were used, an etch process must be developed which can expose the source and drain 34 through the depth Y while also exposing the top electrode through the depth Z without over-etching or damaging the top electrode 54 and 56 to a large extent.

It has been found that in order to etch through the oxide layers down to the depth Y, the significant over-etch or over exposure of etchant chemistry to the capacitor electrode exposed by the depth Z results in significant damage to the top electrode of the ferroelectric capacitor in FIG. 7. This capacitor electrode damage reduces yield and product performance (e.g., may affect contact resistance). Therefore, by forming the tungsten (W) plug 44 earlier in FIGS. 2 and 3 and protecting the tungsten (W) plug 44 via the region 48a in FIGS. 3–6, a complex etch which is needed to etch through the entire depth Y while supporting the etch depth Z is no longer needed. Instead, an etch is needed only to form the plugs 60 while maintaining the capacitor electrode is an acceptable state. This is much easier to achieve than an etch process to simultaneously etch the depths Z and Y. Only plug 60 need be formed in FIG. 7 since the plug 44, which is in contact to the source/drain 34, was previously formed and protected in FIGS. 2–3.

Therefore, the process of FIGS. 2–6 not only allows for ferroelectric DRAM integration into MOS tungsten plug technology without significant logic process disruption or damage, but also allows for improved yield through reduction of over-etch processing. Therefore, the capacitor layers 54 and 56 in FIG. 7 are exposed to much less over-etch and must less damage than prior art capacitors will experience. This additional advantage is obtained once again without complicating conventional MOS logic device processing, without requiring logic gate re-design, and without adding extra mask steps to the embedded DRAM or MOS logic process.

Figure 8:
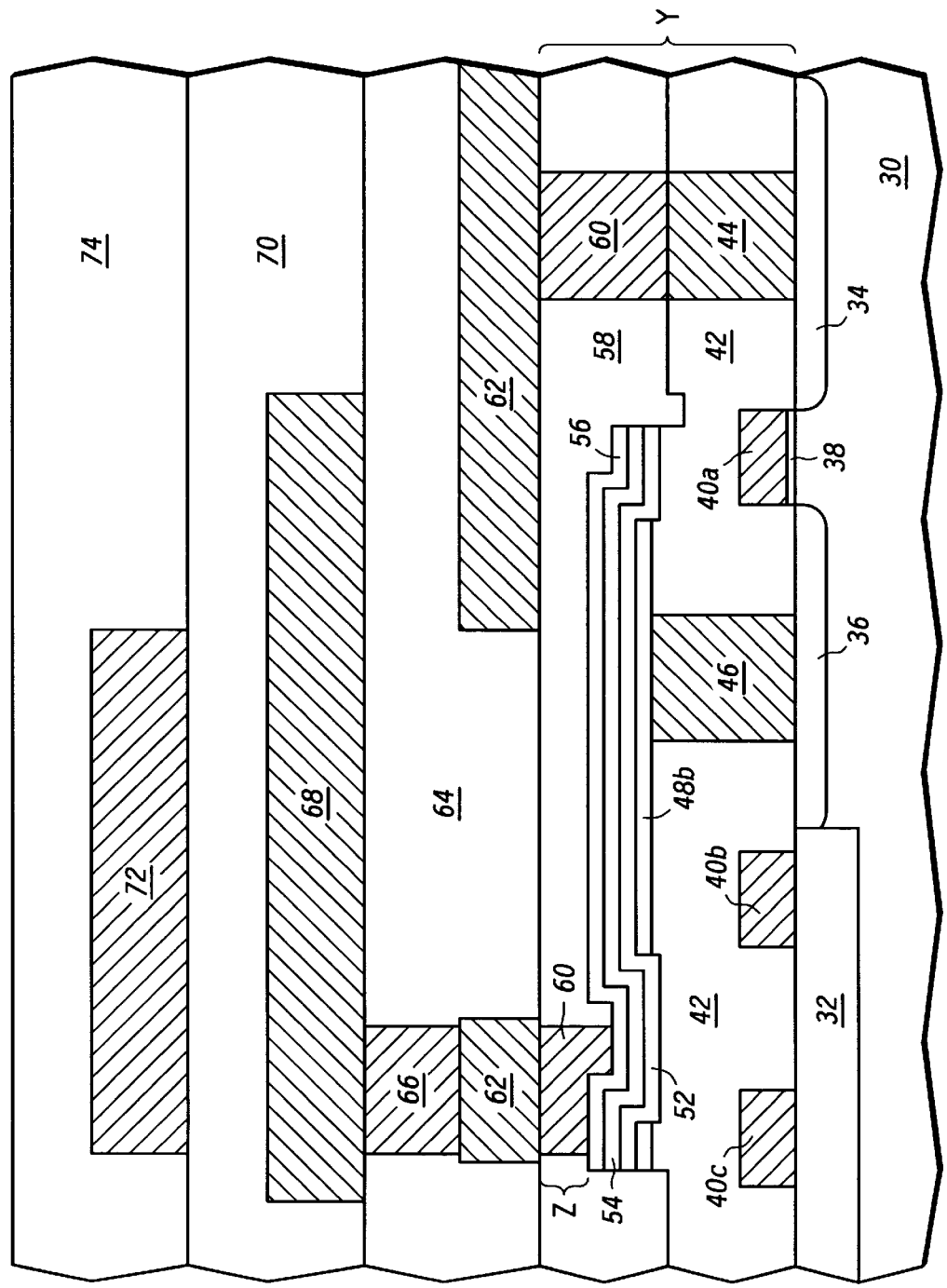

FIG. 8 illustrates all the back-end processing needed to interconnect the capacitors, gate electrodes, and source and drains formed in FIGS. 2–7 to form a functional memory array and CPU MOS logic structure on the same chip. FIG. 8 illustrates a first level of metal 62 with an inter-level dielectric (ILD) 64. Further, CMP and conductive plug processing is used to form a plug 66. Dual in-laid processing or damascene processing may be used herein. FIG. 8 also illustrates a second level metal 68 and yet another inter-level dielectric (ILD) 70. A final level of metal 72 which also forms integrated circuit (IC) bond pads (not illustrated) is encapsulated or passivated by a passivation layer 74 which is one of either plasma enhanced nitride (PEN), phosphosilicate glass (PSG), oxynitride, or some combination thereof.

While the present invention has been illustrated and described with reference to specific embodiments, further modifications and improvements will occur to those skilled in the art. For example, selective growth techniques may be used to form conductive plugs herein. It is to be understood, therefore, that this invention is not limited to the particular illustrated embodiments and that it is intended in the appended claims to cover all modifications that do not depart from the spirit and scope of this invention.

What is claimed is:

1. A method for forming a semiconductor device, the method comprising the steps of:

forming a transistor within a substrate, the transistor having a first current electrode and a second current electrode;

forming a first conductive contact plug to the first current electrode of the transistor;

forming a second conductive contact plug, separated from the first conductive contact plug, in contact with the second current electrode of the transistor;

forming a first barrier region and a second barrier region wherein the first barrier region overlies the first conductive contact plug and the second barrier region overlies the second conductive contact plug;

forming a capacitor dielectric in contact with the first barrier region, the capacitor dielectric being exposed to an ambient wherein the second barrier region prevents the ambient from coming into substantial contact with the second conductive contact plug whereby oxidation of the first and second conductive plug is substantially avoided;

forming at least one top electrode conductive layer over the capacitor dielectric; and etching portions of the at least one top electrode conductive layer from the semiconductor device whereby a capacitor is formed in electrical contact with the first conductive contact plug.

2. The method of claim 1 wherein the first barrier region functions as a bottom capacitor electrode which underlies the capacitor dielectric.

3. The method of claim 1 wherein the step of etching further comprises:
etching the capacitor dielectric along with the at least one top electrode conductive layer using a same etch masking layer.

4. The method of claim 1 wherein the step of forming a capacitor dielectric further comprises:
etching the capacitor dielectric before formation of the at least one top electrode conductive layer.

5. The method of claim 1 wherein the step of etching further comprises:
removing the second barrier region from the second conductive contact plug.

6. The method of claim 1 wherein the step of etching further comprises:
removing the second barrier region from the second conductive contact plug via ion milling.

7. The method of claim 1 wherein the step of etching further comprises:
removing the second barrier region from the second conductive contact plug via an etch chemistry comprising chlorine.

8. The method of claim 1 wherein the step of forming the capacitor dielectric further comprises:
forming the capacitor dielectric as a ferroelectric material.

9. The method of claim 1 wherein the step of forming the capacitor dielectric further comprises:
forming the capacitor dielectric as a BST material.

10. The method of claim 1 wherein the step of forming a capacitor dielectric further comprises:
annealing the capacitor dielectric in an ambient wherein the second barrier region prevents the ambient from oxidizing the second conductive contact plug.

11. The method of claim 1 wherein the step of forming a capacitor dielectric further comprises:
annealing the capacitor dielectric in an ambient comprising oxygen after the capacitor dielectric is deposited.

12. The method of claim 11 wherein the step of forming a capacitor dielectric further comprises:
annealing the capacitor dielectric at a temperature between 500° C. and 650° C.

13. The method of claim 1 wherein the step of forming a capacitor dielectric further comprises:
exposing the capacitor dielectric to ambient comprising oxygen while the capacitor dielectric is being formed.

14. The method of claim 1 wherein the step of forming a capacitor dielectric further comprises:
exposing the capacitor dielectric to ambient comprising oxygen by sputtering the capacitor dielectric from a sputtering target that contains oxygen.

15. The method of claim 1 wherein the steps of forming the first and second conductive contact plugs further comprises:
forming the first and second conductive contact plugs from a material comprising tungsten.

16. The method of claim 1 wherein the steps of forming the first and second conductive contact plugs further comprises:
forming the first and second conductive contact plugs by depositing a barrier layer comprising titanium and depositing a material comprising tungsten onto the barrier layer.

17. The method of claim 1 wherein the steps of forming the first and second conductive contact plugs further comprises:
forming the first and second conductive contact plugs from a material comprising silicon.

18. The method of claim 1 wherein the step of forming a first barrier region and a second barrier region further comprises:
forming the first and second barrier regions from a material comprising iridium.

19. The method of claim 1 wherein the step of forming a first barrier region and a second barrier region further comprises:
forming the first and second barrier regions with a first region of iridium and a second region of platinum.

20. The method of claim 1 wherein the step of forming a first barrier region and a second barrier region further comprises:
forming the first and second barrier regions with a region of iridium oxide.

21. The method of claim 1 further comprising:
forming the transistor and capacitor into an array of transistors and capacitors which form a memory array and integrating the memory array onto a substrate which also contains a plurality of transistors intercoupled to form a CPU.

22. The method of claim 1 wherein the step of forming the first and second conductive contact plugs further comprises:
forming the first and second conductive contact plugs by chemical vapor depositing a layer of material and chemically mechanically polishing the layer of material to form the first and second conductive contact plugs.

23. A method for forming a semiconductor device, the method comprising the steps of:
forming a transistor within a substrate, the transistor having a first current electrode and a second current electrode;

forming a first conductive contact plug to the first current electrode of the transistor and a second conductive contact plug in contact with the second current electrode of the transistor, both the first and second conductive contact plugs comprising tungsten and being formed by chemical mechanical polishing a layer comprising tungsten;

forming a first barrier region and a second barrier region wherein the first barrier region overlies the first conductive contact plug and the second barrier region overlies the second conductive contact plug, the first barrier region being made at least partially from iridium and functioning as at least a portion of a bottom capacitor electrode;

forming a capacitor dielectric in contact with the first barrier region, the capacitor dielectric being exposed to an oxygen ambient wherein the second barrier region prevents the oxygen ambient from oxidizing the second conductive contact plug;

forming a top electrode conductive layer comprising iridium over the capacitor dielectric to form at least part of a top capacitor electrode;

etching portions of the top electrode conductive layer, the capacitor dielectric, and the second barrier region from the semiconductor device whereby a capacitor is formed in electrical contact with the first conductive contact plug; and forming a third and fourth conductive plug wherein the third conductive plug forms a bit line contact to the second conductive contact plug and the fourth conductive contact plug electrically contacts the top capacitor electrode.

24. A method for forming a semiconductor device, the method comprising the steps of:

forming a tungsten plug connected to a current electrode of a transistor;

forming a first iridium layer on top of the tungsten plug, the first iridium layer functioning as at least a portion of a bottom capacitor electrode;

forming a ferroelectric dielectric overlying the first iridium layer;

exposing the ferroelectric dielectric to an oxygen anneal whereby the tungsten plug is protected from the oxygen anneal by the first iridium layer; and forming a conductive layer over the ferroelectric dielectric, the conductive layer functioning as at least a portion of a top capacitor electrode.

25. The method of claim 24 wherein the step of forming a conductive layer comprises the conductive layer being a second iridium layer.

26. The method of claim 24 further comprising:

forming a platinum layer between the first iridium layer and the ferroelectric dielectric.

27. The method of claim 24 further comprising:

forming a platinum layer between the conductive layer and the ferroelectric dielectric.

28. The method of claim 27 further comprising:

forming a titanium nitride layer above the conductive layer.

29. The method of claim 24 further comprising:

forming a layer comprising titanium above the conductive layer.

30. The method of claim 24 further comprising:

forming an iridium oxide layer in contact with one of either the first iridium layer or the conductive layer.

31. A method for forming a semiconductor device, the method comprising the steps of:

forming a plurality of conductive plugs comprising tungsten on the semiconductor device, a first set of the plurality of conductive plugs contacting MOS logic gates in the semiconductor device and a second set of the plurality of conductive plugs which are different from the first set contacting a DRAM capacitor within the semiconductor device; and forming an iridium layer which forms a plurality of iridium DRAM capacitor electrodes overlying the second set of conductive plugs and forms protection regions over the MOS logic gates;

eventually removing portions of the iridium layer over the first set of conductive plugs so that no iridium overlies the first set of conductive plugs of the semiconductor device.

32. The method of claim 31 further comprising:

forming an iridium oxide layer in contact with the iridium layer.

33. The method of claim 31 further comprising:

forming a platinum layer in contact with the iridium layer.

34. The method of claim 31 wherein the iridium layer is formed as at least a portion of a bottom capacitor electrode and wherein the method further comprises:

forming a capacitor dielectric layer overlying the iridium layer where the capacitor dielectric has a high dielectric constant; and forming a top capacitor electrode overlying the capacitor dielectric layer to form capacitor comprising the iridium layer.

35. The method of claim 31 further comprising:

forming a ferroelectric capacitor dielectric layer overlying the iridium layer; and exposing the ferroelectric capacitor dielectric layer to an oxygen anneal.

36. The method of claim 31 further comprising:

forming a BST ferroelectric dielectric layer overlying the iridium layer; and exposing the BST ferroelectric dielectric layer to an oxygen anneal.

37. The method of claim 31 wherein the step of forming a conductive plug further comprises:

forming a titanium/tungsten liner layer as a portion of the conductive plug.

38. The method of claim 31 wherein the step of forming a conductive plug further comprises:

forming a titanium nitride layer as a portion of the conductive plug.

39. The method of claim 31 wherein the step of forming a conductive plug further comprises:

forming a tungsten silicide region as a portion of the conductive plug.

* * * * *